United States Patent [19]

Kalis

[11] Patent Number: 5,377,078
[45] Date of Patent: Dec. 27, 1994

[54] APPARATUS MOUNTING A POWER SEMICONDUCTOR TO A HEAT SINK

[75] Inventor: Robert M. Kalis, Prairie Village, Kans.

[73] Assignee: Relm Communications Inc., Melbourne, Fla.

[21] Appl. No.: 9,278

[22] Filed: Jan. 26, 1993

[51] Int. Cl.⁵ .............................................. H05K 7/20
[52] U.S. Cl. ..................................... 361/707; 165/185; 174/16.3; 257/719; 361/713
[58] Field of Search ................. 165/80.3, 185; 174/16.3; 257/707, 718, 719, 727; 361/773, 704, 705-707, 713, 718, 719

[56] References Cited

U.S. PATENT DOCUMENTS

| | | | |
|---|---|---|---|
| 3,911,327 | 10/1975 | Murari | 317/100 |
| 4,563,725 | 1/1986 | Kirby | 361/388 |
| 4,654,754 | 3/1987 | Daszkowski | 361/388 |
| 4,972,294 | 11/1990 | Moses, Jr. | 361/386 |
| 5,019,942 | 5/1991 | Clemens | 361/388 |
| 5,241,453 | 8/1993 | Bright | 361/704 |

FOREIGN PATENT DOCUMENTS

| | | | |
|---|---|---|---|
| 3304952 | 8/1984 | Germany | 361/704 |
| 1086003 | 10/1967 | United Kingdom | 174/16.3 |

Primary Examiner—Gerald P. Tolin
Attorney, Agent, or Firm—Allegretti & Witcoff, Ltd.

[57] ABSTRACT

An apparatus and a method of mounting a power semiconductor (10) to an external heat sink (18) when both fastening faces (11, 13) of the semiconductor are inaccessible during the assembly process. The apparatus comprises a nut plate (20) that mates with the semiconductor (10) and a thermally conductive layer (28) that engages the nut plate (20) and wraps around the semiconductor (10) in a captive manner. The external heat sink (18) threadably engages the nut plate (20) without the need to access either fastening face (11, 13) of the semiconductor (10).

7 Claims, 3 Drawing Sheets

APPARATUS MOUNTING A POWER SEMICONDUCTOR TO A HEAT SINK

FIELD OF THE INVENTION

This invention relates to mounting a power semiconductor to a heat sink, and more particularly, to mounting a power semiconductor to a heat sink in a blind assembly.

BACKGROUND OF THE INVENTION

Generally, it is beneficial to mount power semiconductors to an external heat sink to facilitate the dissipation of heat generated by the power semiconductor during its operation. Ordinarily, the assembly consists of a thermally conductive insulator interposed between the semiconductor and heat sink to improve the heat transfer from the semiconductor to the heat sink. The standard method for mounting this type of assembly is to pass screw fasteners through the semiconductor and the insulator and threading the screw fasteners into the heat sink. If the heat sink does not have threaded openings, nuts may also be used. The configuration of the heat sink, however, may prevent this simple assembly.

The size and shape of the heat sink will vary depending upon the amount of heat generated by a particular power semiconductor design and the available space to mount the heat sink on or near the printed circuit board. A heat sink which requires a large surface area and that must be mounted on or near a circuit board with space restrictions causes the greatest problems for a designer. Many times a designer must be creative in shaping the heat sink to maximize its surface area and at the same time fitting it into the available space on or near the circuit board. The size and placement of the heat sink, however, may prevent the accessibility to both of the mounting sides of the power semiconductor and make it impossible to attach the heat sink and thermally conductor insulator to the semiconductor using conventional fastening means.

Therefore, there is a need to provide an apparatus and method for mounting a power semiconductor and thermally conductive insulator to a heat sink when there is limited or no access to both sides of the power semiconductor, commonly known as a blind-type assembly.

SUMMARY OF THE INVENTION

The apparatus for mounting a power semiconductor to a heat sink in a blind assembly comprises a supporting means in cooperation with a thermally conductive elastomeric sheet that fastenably surround the power semiconductor in a captive manner to form an assembly that may be attached to a heat sink using only screw fastening means. By captive manner, it is meant that the semiconductor remains sandwiched between the supporting means and thermally conductive elastomeric sheet and held in such position. A blind assembly occurs when the heat sink is sized and shaped in such a way that makes it impossible to access either fastening face of the semiconductor once it is positioned against the heat sink.

It is therefore an object of the invention to provide a means to mount a power semiconductor and a thermally conductive insulator to a heat sink in a blind assembly.

It is an advantage of the invention in that the components are free to float to allow for dimensional variations between the components while being assembled to facilitate the assembly process.

It is a further advantage of the invention in that it can be used to mount power semiconductors or other similarly constructed electronic devices to various mounting brackets that restrict or prevent the accessibility to both mounting sides of the electronic device.

BRIEF DESCRIPTION OF THE DRAWINGS

The above and other objects and advantages of this invention will be apparent on consideration of the following detailed description, taken in conjunction with the accompanying drawings, in which like reference characters refer to like parts throughout, and in which.

DETAILED DESCRIPTION OF THE INVENTION

Figure 1:
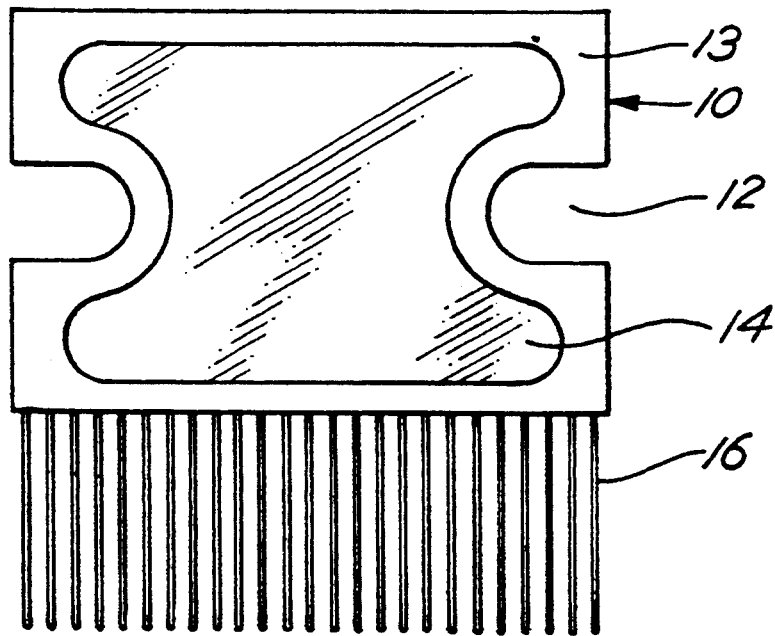
FIG. 1 is an enlarged rear view of a power semiconductor designed for vertical mounting.

FIG. 1 illustrates the rear face of a typical power semiconductor 10, such as audio amplifiers catalog nos. SIL 9P/SOT 131, or DBS 13P/SOT 141, and in particular, catalog no. TDA 1515A manufactured by Phillips Semiconductors of Sunnyvale, Calif. The rear face 13 comprises an integral heat sink 14 to dissipate the heat generated by semiconductor 10. Semiconductor 10 is designed to mount vertically on a circuit board as demonstrated by the positioning of all terminal connectors 16 along one edge of semiconductor 10. Mounting semiconductor 10 in a vertical fashion facilitates contacting heat sink 14 with an external heat sink 18. Ordinarily, a pair of screw and nut fastening means would be sufficient to mount this type of semiconductor to a heat sink if the shape of the heat sink allows access to the fastening side 11 (not shown) of the semiconductor.

Figure 2:
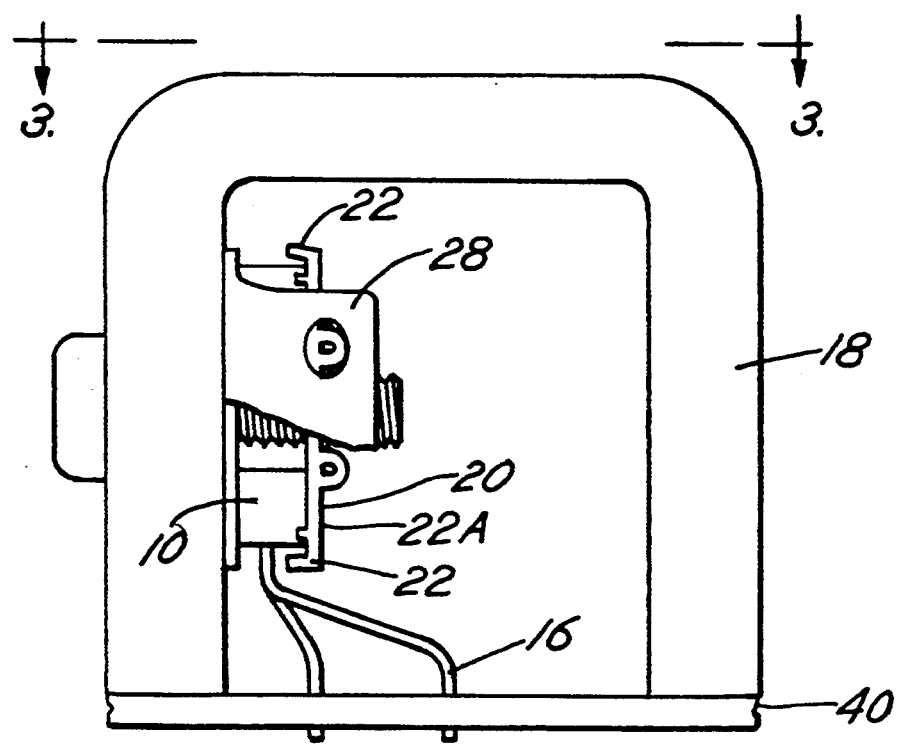
FIG. 2 is an enlarged side elevation view of the invention with a portion of the thermal conductor cut away to more clearly illustrate the elements of the invention in their intended use.
Figure 3:
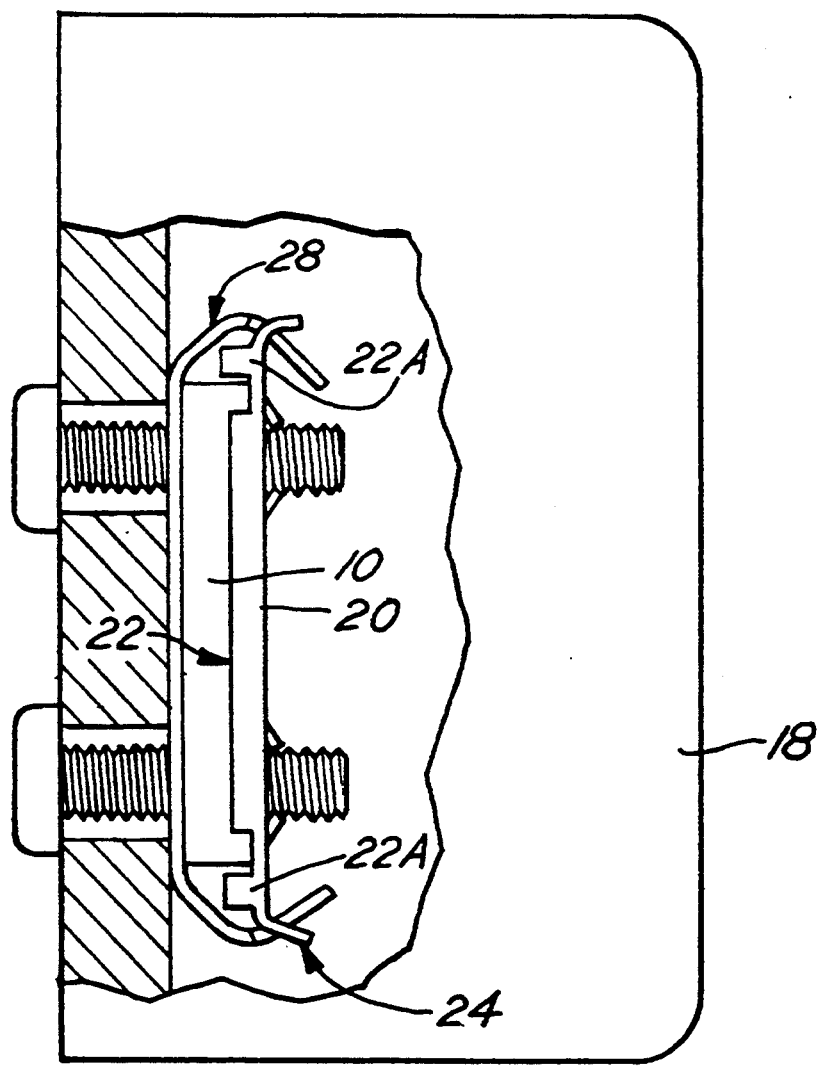
FIG. 3 is a top view of the invention with a portion of the external heat sink cut away to illustrate the elements of the invention in their intended use.

FIG. 2 illustrates semiconductor 10 electrically connected via terminal connectors 16 to circuit board 40 in a vertical position. External heat sink 18 completely encloses semiconductor 10 and prohibits any access to fastening face 11 of semiconductor 10. The heat sink may be required to be shaped as shown in FIGS. 2 and 3 in order to provide a large surface area to effectively dissipate the heat generated by a power semiconductor. Alternate, more conventionally-shaped heat sinks may not be practical due to space limitations on the circuit board or in the electronic enclosure.

Figure 4:
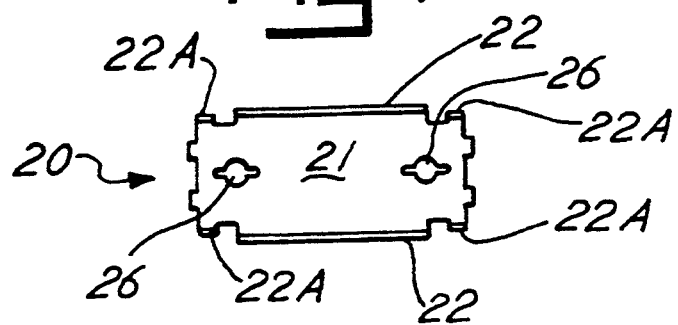
FIG. 4 is a view of the mounting face of the nut plate.
Figure 4A:
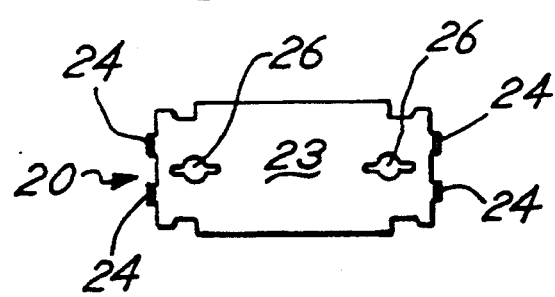
FIG. 4A is a view of the side opposite the mounting face of the nut plate.
Figure 5:
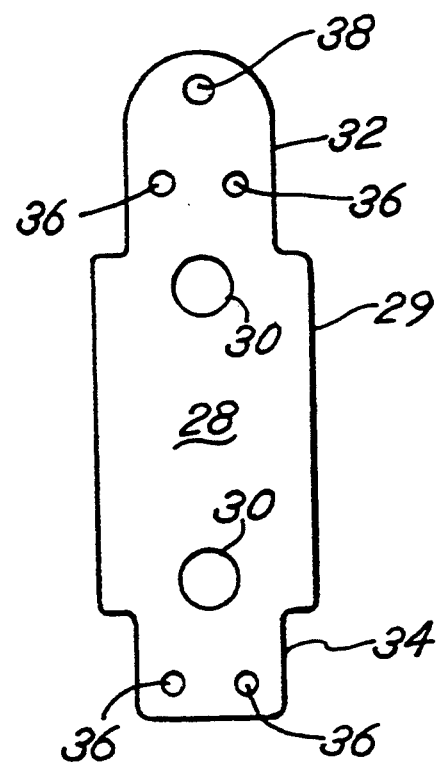
FIG. 5 is a view of the compressible thermal conductor.

The apparatus to mount semiconductor 10 to heat sink 18 in a blind assembly comprises a nut plate 20, shown in FIGS. 4 and 4A and a compressible thermal conductor 28 shown in FIG. 5. Preferably, nut plate 20 is made from a thin gauge steel for durability, ease of fabrication and its low cost, but it can be made from other materials, such as plastic. Nut plate 20 is generally rectangular in shape and is slightly larger in dimension than semiconductor 10. FIG. 4 illustrates the mounting face 21 of nut plate 20. Along the perimeter of mounting face 21 are generally upwardly-turned guides 22 and 22A. The area defined by guides 22 and 22A is slightly larger than the area of the mounting face of the semiconductor. The difference in area provides for limited alignment capabilities between nut plate 20 and semiconductor 10 discussed below. Guides 22A are inwardly offset from guides 22 so that guides 22A correspond with at least the corner edges of semiconductor 10 and therefore limit the side-to-side alignment capabilities between nut plate 20 and semiconductor 10.

Located on the rear face 23 of nut plate 20, and on opposing ends, are tangs 24, which are generally perpendicular to rear face 23. Tangs 24 provide the attaching means between nut plate 20 and the compressible thermal conductor 28 discussed below.

Nut plate 20 also comprises a pair of screw holes 26 that, when nut plate 20 is properly positioned with semiconductor 10, align with each corresponding notch 12 of semiconductor 10. Screw holes 26 are sized to threadably engage a conventional screw and also so they are smaller than corresponding notch 12. Preferably, screw holes 26 are formed from the nut plate material, that is punched and formed. Alternatively, screw holes 26 may be separate nut members either welded, pressed into or captivated onto nut plate 20. During assembly both screw holes 26 align with its corresponding notch 12 regardless of the position of nut plate 20 with respect to the semiconductor 10 as restricted by guides 22 and 22A. Therefore, nut plate 20 can seek a position, or float, to compensate for locational variations between screw holes 26 and notches 12.

The compressible thermal conductor 28 is an interface between integral heat sink 14 and external heat sink 18. Thermal conductor 28 can be made out of any material that is compressible, that can withstand high temperatures and that effectively conducts heat. In the preferred embodiment, thermal conductor 28 is a fiberglass fabric impregnated with silicone rubber, generally about 0.005 to 0.010 inches thick, such as that manufactured by either Berquist of Minneapolis, Minn. or CHR Industries, Inc. of New Haven, Conn.

A microscopic examination of the heat sink surfaces reveal the purpose of thermal conductor 28. Microscopic peaks and valleys exist on each heat sink surface that prevent a true surface-to-surface contact between heat sinks 14 and 18. When the two surfaces contact, the peaks of one surface may not interface with the valleys of the other surface. Therefore, the contact between the two heat sink surfaces is limited to point-to-point contact. This limits the amount of heat sink surface area for heat transfer by conduction. Furthermore, the resulting air interface between the surfaces is a very poor thermal conductor as compared to silicone rubber. Thermal conductor 28 interfaces between heat sinks 14 and 18 and fills the valleys of each surface. The compressible characteristic of thermal conductor 28 smooths the surfaces of each heat sink and provides a surface-to-surface contact between heat sinks 14 and 18. This provides for a more efficient heat transfer.

Thermal conductor 28 comprises a main body 29, which is dimensioned to generally correspond to the size fastening face 11 of semiconductor 10. A pair of clearance holes 30 are positioned on main body 29 that generally correspond in location to align with screw holes 26 and notches 12. Clearance holes 30 are oversized in relation to the securing screw fastener to allow for compensation of dimensional variations between the components during assembly.

At either end of main body 29 are securing tabs 32 and 34. Each tab 32 and 34 comprises a pair of holes 36 that fastenably engage the corresponding tangs 24 on nut plate 20. Preferably, tab 32 is over-sized to aid an assembler in gripping and attaching thermal conductor 28 to nut plate 20 as described below. An opening 38 may be added to tab 32 to the assembler to grip tab 32 during assembly.

The method to attach a power semiconductor 10 to a heat sink 18 in a blind assembly using the preferred embodiment consists of: vertically mounting power semiconductor 10 onto circuit board 40; placing mounting face 21 of nut plate 20 onto fastening face 11 of power semiconductor 10; detachably fastening thermal conductor 28 to nut plate 20 by engaging securing tab 34 to the first pair of tangs 24; wrapping thermal conductor 28 around semiconductor 10, wherein thermal conductor 28 engages heat sink 14; fastenably engaging securing tab 32 to the second pair of tangs 24, wherein nut plate 20 and thermal conductor 28 captively surround semiconductor 10 forming an assembly; aligning nut plate 20, semiconductor 10 and thermal conductor 28 wherein the corresponding screw holes 26, clearance holes 30 and notches 12 are in continuous communication; and fastening an external heat sink to the assembly using only conventional screw fasteners.

It will be understood that the particular embodiments described above are only illustrative of the principles of the present invention, and that various modifications could be made by those skilled in the art without departing from the scope and spirit of the present invention, which is limited only by the claims that follow.

What is claimed is:

1. A semiconductor assembly comprising, in combination:
    an enclosure substantially defining an internal cavity, at least a portion of said assembly defining an external heat sink;
    a semiconductor, having a fastening face, within said internal cavity of said enclosure;
    a support plate demountably mating with said fastening face of said semiconductor, said plate defining two ends and each of said ends including a catch;
    a sheet of compressible, thermally conductive material, said sheet including two ends, said catches of said support plate detachably engaging said ends of said sheet and captively holding said semiconductor between said sheet and said ends of said support plate; and
    a fastener detachably engaging said heat sink and said support plate, holding said support plate against said semiconductor, said semiconductor against said sheet, and said sheet against said heat sink, whereby said sheet and support plate may float with respect to said heat sink as said fastener is tightened.

2. An assembly as claimed in claim 1 wherein said fastener is elongate, extending through both said support plate and said sheet of compressible, thermally conductive material.

3. An assembly as claimed in claim 20 wherein said fastener comprises a screw for threadably engaging said support plate.

4. An assembly as claimed in claim 1 further comprising a plurality of guides, extending from said support plate, for limiting movement of said semiconductor when said fastening face of said semiconductor is mated to said support plate.

5. An assembly as claimed in claim 1 wherein said ends of said sheet define a plurality of apertures and said catches include a plurality of tangs for extending through said apertures.

6. An assembly as claimed in claim 1 wherein said support plate and sheet substantially surround said semiconductor.

7. An assembly as claimed in claim 1 wherein said sheet is comprised of a fiberglass fabric substantially impregnated with rubber.

* * * * *